United States Patent
Leong et al.

(10) Patent No.: US 12,512,664 B2
(45) Date of Patent: Dec. 30, 2025

(54) CASCODE-BASED SWITCH DEVICE WITH VOLTAGE CLAMP CIRCUIT

(71) Applicant: Infineon Technologies Austria AG, Villach (AT)

(72) Inventors: Kennith Kin Leong, Villach (AT); Herwig Wappis, Villach (AT)

(73) Assignee: Infineon Technologies Austria AG, Villach (AT)

( * ) Notice: Subject to any disclaimer, the term of this patent is extended or adjusted under 35 U.S.C. 154(b) by 149 days.

(21) Appl. No.: 18/345,158

(22) Filed: Jun. 30, 2023

(65) Prior Publication Data

US 2025/0007273 A1    Jan. 2, 2025

(51) Int. Cl.
*H02H 3/20*    (2006.01)

(52) U.S. Cl.
CPC .................................... *H02H 3/20* (2013.01)

(58) Field of Classification Search
CPC ....... H02H 3/20; H01L 27/02; H01L 27/0248; H01L 27/088; H01L 27/08; H01L 27/0814; H01L 25/18; H01L 27/06
USPC ........................................................... 361/56
See application file for complete search history.

(56) References Cited

U.S. PATENT DOCUMENTS

| | | |
|---|---|---|
| 7,164,589 B1 | 1/2007 | Soldano et al. |
| 7,595,680 B2 | 9/2009 | Morita et al. |
| 7,768,758 B2 | 8/2010 | Maier et al. |
| 7,825,467 B2 | 11/2010 | Willmeroth et al. |
| 7,852,137 B2 | 12/2010 | Machida et al. |
| 7,868,353 B2 | 1/2011 | Machida et al. |

(Continued)

FOREIGN PATENT DOCUMENTS

| | | |
|---|---|---|
| CN | 102640288 A | 8/2012 |
| CN | 105871365 A | 8/2016 |

(Continued)

OTHER PUBLICATIONS

Oladele, Olanrewaju Kabir, et al., "Optimizing Switching Performance of Cascade-Light SiC JFET Bidirectional Switch for Matrix Converter", IEEE International Power Electronics and Application Conference and Exposition (PEAC), 2018, pp. 1-6.

(Continued)

*Primary Examiner* — Danny Nguyen
(74) *Attorney, Agent, or Firm* — Murphy, Bilak & Homiller, PLLC

(57) ABSTRACT

A switch device includes: a first power transistor die including a normally-on power transistor; a second power transistor die including a normally-off power transistor having a drain electrically connected to a source of the normally-on power transistor to form a cascode device; and a capacitor electrically connected between a gate of the normally-on power transistor and a source of the normally-off power transistor. Both power transistors have at most half a maximum rated drain-to-source voltage as the switch device. The second power transistor die further includes a voltage clamp circuit having a normally-off clamp transistor with a drain electrically connected to the gate of the normally-on power transistor and a source electrically connected to the source of the normally-off power transistor, and diode(s) between the drain and a gate of the normally-off clamp transistor. Additional switch devices embodiments are described.

23 Claims, 7 Drawing Sheets

(56) References Cited

U.S. PATENT DOCUMENTS

| | | |
|---|---|---|
| 7,875,907 B2 | 1/2011 | Honea et al. |
| 8,344,424 B2 | 1/2013 | Suh et al. |
| 8,487,667 B2 | 7/2013 | Iwamura |
| 8,604,512 B2 | 12/2013 | Morita |
| 8,649,198 B2 | 2/2014 | Kuzumaki et al. |
| 8,664,690 B1 | 3/2014 | Chen et al. |
| 9,276,569 B2 | 3/2016 | Ikeda |
| 9,443,845 B1 | 9/2016 | Stafanov et al. |
| 10,224,924 B1 | 3/2019 | Leong |
| 10,296,033 B2 | 5/2019 | Adachi |
| 10,411,698 B2 | 9/2019 | Sato et al. |
| 10,784,853 B2 | 9/2020 | Leong |
| 10,811,525 B2 | 10/2020 | Kinoshita et al. |
| 10,979,032 B1 | 4/2021 | Leong et al. |
| 11,088,688 B2 | 8/2021 | Pala |
| 12,051,979 B2 | 7/2024 | Kanomata et al. |
| 12,057,828 B2 | 8/2024 | Leong et al. |
| 12,081,207 B2 | 9/2024 | Leong et al. |
| 2006/0145744 A1 | 7/2006 | Diorio et al. |
| 2009/0167411 A1 | 7/2009 | Machida et al. |
| 2009/0206363 A1 | 8/2009 | Machida et al. |
| 2010/0155775 A1 | 6/2010 | Gauthier et al. |
| 2011/0016440 A1 | 1/2011 | Bergmann et al. |
| 2012/0026632 A1 | 2/2012 | Acharya et al. |
| 2012/0139589 A1 | 6/2012 | Machida et al. |
| 2012/0217542 A1 | 8/2012 | Morita |
| 2012/0262220 A1 | 10/2012 | Springett |
| 2012/0287688 A1 | 11/2012 | Fornage et al. |
| 2014/0085760 A1 | 3/2014 | Lui |
| 2014/0145208 A1 | 5/2014 | Rose et al. |
| 2014/0197448 A1 | 7/2014 | Galy et al. |
| 2014/0203289 A1 | 7/2014 | Liu et al. |
| 2014/0264431 A1 | 9/2014 | Lal |
| 2014/0374766 A1 | 12/2014 | Bahl et al. |
| 2015/0043116 A1 | 2/2015 | Weyers et al. |
| 2015/0180469 A1 | 6/2015 | Kim |
| 2015/0256163 A1 | 9/2015 | Weis |
| 2016/0079233 A1 | 3/2016 | Deboy et al. |
| 2016/0322485 A1 | 11/2016 | Padmanabhan et al. |
| 2016/0344381 A1* | 11/2016 | Cai .................. H03K 17/165 |
| 2017/0047841 A1 | 2/2017 | Zojer et al. |
| 2017/0062419 A1* | 3/2017 | Rose ................ H10D 84/0163 |
| 2017/0084600 A1* | 3/2017 | Isobe ................ H10D 62/83 |
| 2017/0103978 A1 | 4/2017 | Prechtl et al. |
| 2017/0338809 A1 | 11/2017 | Stefanov et al. |
| 2018/0219008 A1 | 8/2018 | Prechtl et al. |
| 2019/0068181 A1 | 2/2019 | Leong |
| 2019/0199289 A1 | 6/2019 | Wei et al. |
| 2019/0252921 A1 | 8/2019 | Lethellier et al. |
| 2019/0326280 A1 | 10/2019 | Imam et al. |
| 2020/0098745 A1 | 3/2020 | Roig-Guitart |
| 2020/0287536 A1 | 9/2020 | Udrea et al. |
| 2020/0343167 A1 | 10/2020 | Othman et al. |
| 2021/0210481 A1* | 7/2021 | Guan ................ H01L 23/3171 |
| 2022/0084916 A1* | 3/2022 | Sugiyama ......... H01L 23/49541 |
| 2022/0157981 A1 | 5/2022 | Gupta et al. |
| 2022/0262960 A1 | 8/2022 | Schiele et al. |
| 2022/0416784 A1 | 12/2022 | Harrison et al. |
| 2024/0072161 A1 | 2/2024 | Sharma |

FOREIGN PATENT DOCUMENTS

| | | |
|---|---|---|
| EP | 3249815 A1 | 11/2017 |
| TW | 200541073 A | 12/2005 |
| WO | 2005002054 A1 | 1/2005 |
| WO | 2017159559 A1 | 9/2017 |
| WO | 2021206065 A1 | 10/2021 |

OTHER PUBLICATIONS

Li, Xueqing, et al., "Medium Voltage Power Module Based on SiC JFETs", IEEE Applied Power Electronics Conference and Exposition (APEC), Mar. 26, 2017, pp. 3033-3037.

Haehre, K., et al., "Switching Speed-Control of an Optimized Capacitor-Clamped Normally—on Silicon Carbide JFET Cascode", 15th International Power Electronics and Motion Control Conference, EPE-PEMC 2012 ECCE Europe, Novi Sad, Serbia, Sep. 4, 2012, pp. DS1a. 11-1-DS1a. 11-5.

"Industry's first 1200V Half Bridge Module based on GaN technology", VisIC Techologies, https://www.psma.com/sites/default/files/uploads/tech-forums-semiconductor/presentations/is012-industrys-first-1200v-half-bridge-module-based-gan-technology.pdf, Nov. 2022, 1-45.

Chen, Ren-Yi, et al., "Study and Implementation of a Current-Fed Full-Bridge Boost DC-DC Converter With Zero—Current Switching for High-Voltage Applications", IEEE Transactions on Industry Applications, vol. 44, No. 4, Jul./Aug. 2008, 1218-1226.

Chowdhury, Dilder, "GaN FETs: Why cascode?", Sep. 30, 2020, pp. 1-6.

Friedli, Thomas, et al., Design and Performance of a 200-KHz All-SiC JFET Current DC-Link Back-to-Back Converter, IEEE Transactions on Industry Applications, vol. 45, No. 5, Sep./Oct. 2009, 1868-1878.

Huber, Jonas Emanuel, "Automatic Reverse Blocking Bidirectional Switch", U.S. Appl. No. 17/542,660, filed Dec. 6, 2021.

Kolar, J.W., et al., "Novel Three-Phase AC-DC-AC Sparse Matrix Converter", IEEE, 2002, 777-787.

Lindemann, A., "A New IGBT with Reverse Blocking Capability", Entwurf fuer EPE Conference, European Conference on Power Electronics and Applications, Graz, Austria, 2001, Posted to Internet on Sep. 11, 2014, 2001, pp. 1-7.

Siemaszko, Daniel, et al., "Active Self-Switching Methods for Emerging Monolithic Bidirectional Switches Applied to Diode-Less Converters", 2009 13th European Conference on Power Electronics and Applications, Sep. 8-10, 2009, 1-9.

Soeiro, Thiago B., et al., "Three-Phase Modular Multilevel Current Source Rectifiers For Electric Vehicle Battery Charging Systems", IEEE, 2013, 623-629.

\* cited by examiner

CASCODE-BASED SWITCH DEVICE WITH VOLTAGE CLAMP CIRCUIT

BACKGROUND

A high breakdown voltage (e.g., greater than 800V) switch device can be realized by connecting a lower rated normally-off power transistor (e.g., 650V or less) and a lower rated normally-on power transistor (e.g., 650V or less) in a cascode configuration. However, the midpoint voltage at the node between the normally-off power transistor and the normally-on power transistor drifts under static DC blocking conditions, i.e., when blocking a constant voltage. A drifting midpoint voltage under static DC blocking conditions eventually causes the normally-on power transistor to turn on, which transfers the entire blocking voltage of the switch device (e.g., 800V or higher) to the normally-off power transistor which is not rated for such a high voltage. Accordingly, the normally-off power transistor can be damaged or destroyed.

Hence, there is a need for an improved cascode-based switch device.

SUMMARY

According to an embodiment of a switch device, the switch device comprises: a first power transistor die that includes a normally-on power transistor having at most half a maximum rated drain-to-source voltage as the switch device; a second power transistor die that includes a normally-off power transistor having at most half the maximum rated drain-to-source voltage as the switch device, wherein a drain of the normally-off power transistor is electrically connected to a source of the normally-on power transistor to form a cascode device; and a first capacitor electrically connected between a gate of the normally-on power transistor and a source of the normally-off power transistor, wherein the second power transistor die further includes a voltage clamp circuit comprising a normally-off clamp transistor having a drain electrically connected to the gate of the normally-on power transistor and a source electrically connected to the source of the normally-off power transistor, and one or more diodes between the drain and a gate of the normally-off clamp transistor.

According to another embodiment of a switch device, the switch device comprises: a first power transistor die that includes a first bidirectional power switch comprising a first source, a second source, a normally-off gate, and a normally-on gate; a second power transistor die that includes a second bidirectional power switch comprising a first source electrically connected to the second source of the first bidirectional power switch to form a cascode device, a second source, a normally-off gate, and a normally-on gate; a first capacitor electrically connected between the normally-on gate of the second bidirectional power switch and the first source of the first bidirectional power switch; and a second capacitor electrically connected between the normally-on gate of the first bidirectional power switch and the second source of the second bidirectional power switch, wherein the first power transistor die further includes a first voltage clamp circuit comprising a first bidirectional clamp switch having a first gate, a second gate, a first source electrically connected to the first source of the first bidirectional power switch, and a second source electrically connected to the normally-on gate of the second bidirectional power switch, and one or more diodes between the first gate and the second source of the first bidirectional clamp switch, wherein the second power transistor die further includes a second voltage clamp circuit comprising a second bidirectional clamp switch having a first gate, a second gate, a first source electrically connected to the normally-on gate of the first bidirectional power switch, and a second source electrically connected to the second source of the second bidirectional power switch, and one or more diodes between the second gate and the first source of the second bidirectional clamp switch.

According to another embodiment of a switch device, the switch device comprises: a first normally off switch; a second normally-off switch; a first bidirectional power switch comprising a first source electrically connected to a drain of the first normally off switch, a second source, a first normally-on gate electrically connected to a source of the first normally off switch, and a second normally-on gate; a second bidirectional power switch comprising a first source electrically connected to the second source of the first bidirectional power switch to form a cascode device, a second source electrically connected to a drain of the second normally off switch, a first normally-on gate, and a second normally-on gate electrically connected to a source of the second normally off switch; a first capacitor electrically connected between the source of the first normally off switch and the first normally-on gate of the second bidirectional power switch; a second capacitor electrically connected between the second normally-on gate of the first bidirectional power switch and the source of the second normally off switch; a first voltage clamp circuit comprising a first bidirectional clamp switch having a first gate, a second gate, a first source electrically connected to the source of the first normally off switch, and a second source electrically connected to the first normally-on gate of the second bidirectional power switch, and one or more diodes between the first gate and the second source of the first bidirectional clamp switch; and a second voltage clamp circuit comprising a second bidirectional clamp switch having a first gate, a second gate, a first source electrically connected to the second normally-on gate of the first bidirectional power switch, and a second source electrically connected to the source of the second normally off switch, and one or more diodes between the second gate and the first source of the second bidirectional clamp switch.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments may be combined unless they exclude each other. Embodiments are depicted in the drawings and are detailed in the description that follows.

DETAILED DESCRIPTION

The embodiments described herein provide a switch device implemented using discrete and/or bidirectional switch devices arranged in a cascode configuration and each having a lower breakdown voltage than the switch device, while maintaining the same number of active gates as a single high voltage device and utilising the entire device in terms of voltage blocking and current conduction. For example, in the case of a 1.2 kV rated switch device, the discrete and/or bidirectional switch devices used to implement the switch device may have a breakdown voltage of 650V. However, the embodiments described herein may be applied to voltage classes other than 650V and the resulting switch device may have a blocking voltage less than or greater than 1.2 kV. For example, the switch devices disclosed herein may have a breakdown voltage of at least 800V and, depending on the number of devices arranged in a cascode configuration, may be implemented using discrete and/or bidirectional switch devices having a breakdown voltage of at most half the breakdown voltage of the switch device. In each case, the switch device includes a voltage clamp circuit that stabilizes the midpoint voltage of the cascode device under static DC blocking conditions.

Described next, with reference to the figures, are exemplary embodiments of switch devices.

Figure 1:
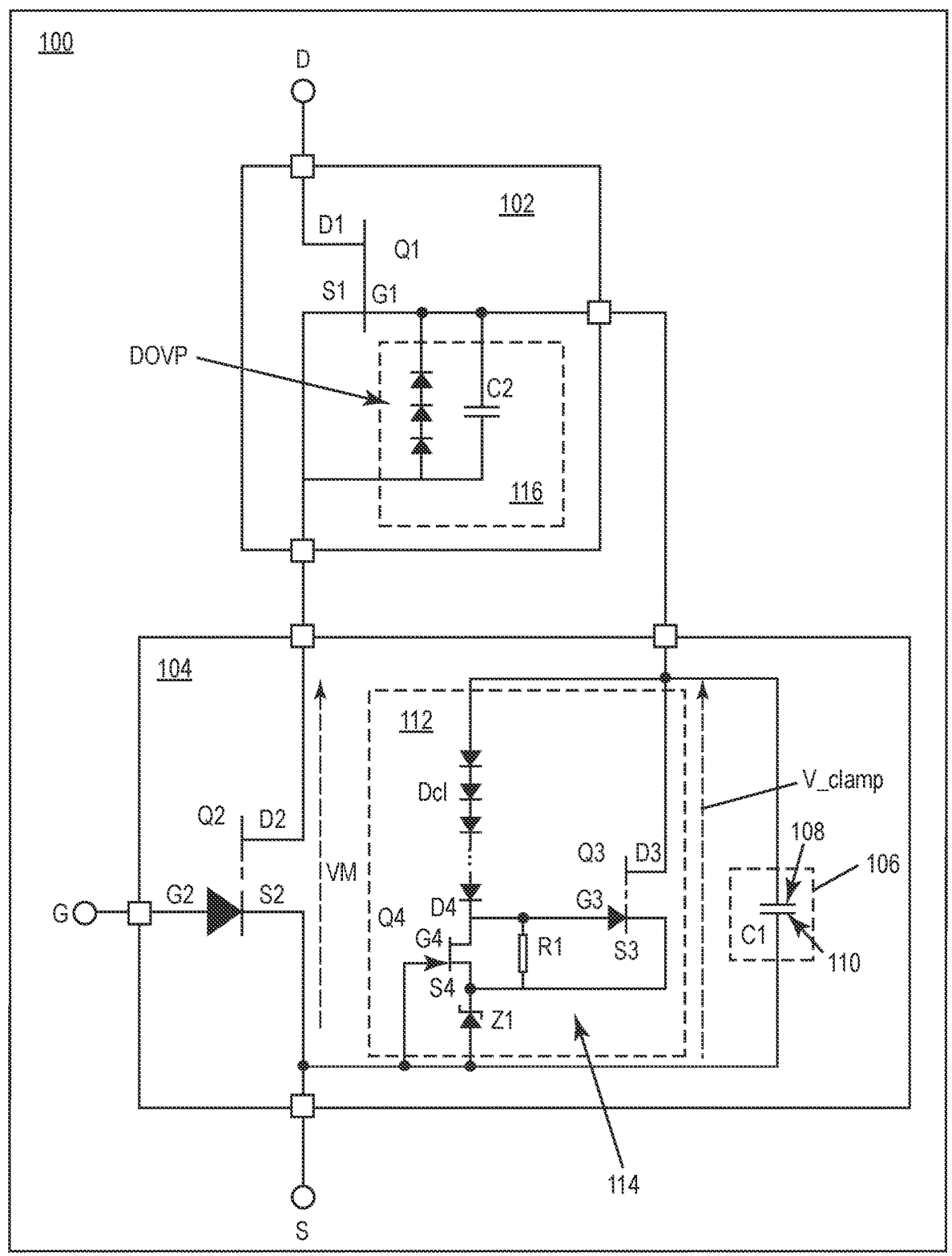
FIG. 1 illustrates a circuit schematic of an embodiment of a unidirectional cascode switch device.

FIG. 1 illustrates an embodiment of a switch device 100. According to this embodiment, the switch device 100 is a unidirectional cascode discrete device based on a first power transistor die (chip) 102 that includes a normally-on (i.e., depletion mode) power transistor Q1 and a second power transistor die 104 that includes a normally-off (i.e., enhancement mode) power transistor Q2. Both the normally-on power transistor Q1 and the normally-off power transistor Q2 have at most half the maximum rated drain-to-source (D-to-S) voltage as the switch device 100.

For the normally-on power transistor Q1, a current conduction channel is present between the drain and source terminals D1, S1 of the normally-on power transistor Q1 absent any voltage being applied to the gate terminal G1 of the normally-on power transistor Q1. For the normally-off power transistor Q2, a current conduction channel is not present between the drain and source terminals D2, S2 of the normally-off power transistor Q2 without a suitable voltage applied to the gate terminal G2 of the normally-off power transistor Q2.

In one embodiment, the power transistor dies 102, 104 are respective GaN dies, the normally-on power transistor Q1 is a normally-on GaN transistor, the normally-off power transistor Q2 is a normally-off GaN transistor, and the maximum rated drain-to-source voltage of the switch device 100 is 800V or higher, e.g., 1.2 kV or higher. In GaN technology, a polarization difference between the GaN channel layer and the AlGaN barrier layer yields a 2-dimensional (2D) 'sheet' of uncompensated charge. The 2D charge sheet is typically positive and causes a 2D electron gas to be formed even if there is no doping. Accordingly, GaN devices tend to be normally-on devices unless an additional device engineering technique such as doping of the barrier with acceptors, gate engineering, etc. is applied to render the device normally-off.

The drain D2 of the normally-off power transistor Q2 is electrically connected to the source S1 of the normally-on power transistor Q1 to form a cascode device. According to this configuration, the drain D1 of the normally-on power transistor Q1 forms the drain D of the cascoded switch device 100 and the source S2 of the normally-off power transistor Q2 forms the source S of the cascoded switch device 100. The cascoded switch device 100 has a single actively controlled (driven) gate G formed by the gate G2 of the normally-off power transistor Q2.

To maximize utilization of both power transistors Q1, Q2, the switch device 100 in FIG. 1 also includes a voltage blocking device 106 electrically connected between the gate G1 of the normally-on power transistor Q1 and the source S2 of the normally-off power transistor Q2. The voltage blocking device 106 blocks a portion of the drain-to-source voltage 'VDS' across the switch device 100 when the cascode device formed by the power transistors Q1 and Q2 is off. In one embodiment, the voltage blocking device 106 is a capacitor C1 having a first terminal 108 electrically connected to the gate G1 of the normally-on power transistor Q1 and a second terminal 110 electrically connected to the source S2 of the normally-off power transistor Q2. The voltage blocking capacitor C1 may be in the pF range if the power transistors Q1 and Q2 are rated for 650V, for example.

The switch device 100 in FIG. 1 also includes a voltage clamp circuit 112 included in the second power transistor die 104. The voltage clamp circuit 112 stabilizes the midpoint voltage 'VM' of the cascode device under static DC blocking conditions. The midpoint voltage VM of the cascode device is the voltage at the node between the normally-off power transistor Q2 and the normally-on power transistor Q1. Without the voltage clamp circuit 112 or with a less optimal voltage clamp circuit that includes just the diodes Dcl, the midpoint voltage VM would drift under static DC blocking conditions, i.e., when the switch device 100 blocks a constant voltage.

The voltage clamp circuit 112 shown in FIG. 1 includes a normally-off clamp transistor Q3 such as a normally-off GaN transistor having a drain D3 electrically connected to the gate G1 of the normally-on power transistor Q1 and a source S3 electrically connected to the source S2 of the normally-off power transistor Q2. As used herein, the phrase "electrically connected" means either a direct connection or a connection through one or more intermediary electrical devices such as a resistor, diode, capacitor, inductor, transistor, etc. For example, in FIG. 1, the drain D3 of the normally-off clamp transistor Q3 is shown directly connected to the gate G1 of the normally-on power transistor Q1 with no intervening electrical device whereas the source S3 of the normally-off clamp transistor Q3 is shown connected to the source S2 of the normally-off power transistor Q2 through a voltage clamp device Z1.

The voltage clamp circuit 112 in FIG. 1 also includes one or more diodes Dcl such as ESD (electrostatic discharge) diode(s) between the drain D3 and the gate G3 of the normally-off clamp transistor Q3.

In FIG. 1, the voltage clamp circuit 112 further includes a pulldown device 114 that prevents turn on of the normally-off clamp transistor Q3 during dynamic switching of the switch device 100. In one embodiment, the pulldown device 114 includes a normally-on pulldown transistor Q4 such as a normally-on GaN transistor and a voltage clamp Z1. The normally-on pulldown transistor Q4 of the pulldown device 114 has a drain D4 electrically connected to the gate G3 of the normally-off clamp transistor Q3, a source S4 electrically connected to the source S3 of the normally-off clamp transistor Q3, and a gate G4 electrically connected to the source S2 of the normally-off power transistor Q2.

The voltage clamp Z1 of the pulldown device 114 is electrically connected between the source S4 of the normally-on pulldown transistor Q4 and the source S2 of the normally-off power transistor Q2. The voltage clamp Z1 is illustrated as a Zener diode because the voltage clamp Z1 behaves like a Zener diode, but may be implemented using a string of one or more ESD diodes. The pulldown device 114 may also include a resistor R1 electrically connected between the gate G3 and the source S3 of the normally-off clamp transistor Q3.

As shown in FIG. 1, the drain D2 of the normally-off power transistor Q2 and the drain D3 of the normally-off clamp transistor Q3 are not the same node. Also, the clamp voltage 'V_clamp' of the clamp circuit 112 can be controlled by the number of diodes Dcl in the chain between the gate G3 and the drain D3 of the normally-off clamp transistor Q3. Simulations show that the midpoint voltage VM of the cascode device stabilise in the seconds range under 800V DC blocking conditions. For example, with 140 ESD diodes Dcl in the chain between the gate G3 and the drain D3 of the normally-off clamp transistor Q3, simulations show that the midpoint voltage VM stabilizes at 444V after 1 sec. With 130 ESD diodes Dcl in the chain between the gate G3 and the drain D3 of the normally-off clamp transistor Q3, the midpoint voltage VM stabilizes at 414V after 1 sec. With 120 ESD diodes Dcl in the chain between the gate G3 and the drain D3 of the normally-off clamp transistor Q3, the midpoint VM stabilizes at 383V after 1 sec. In each case, and once stabilized, the midpoint voltage VM of the cascode device no longer drifted due to leakage. Furthermore, the power consumption of the voltage clamp circuit 112 was only 4.4 µW at 800V DC blocking for this simulation.

Figure 2:
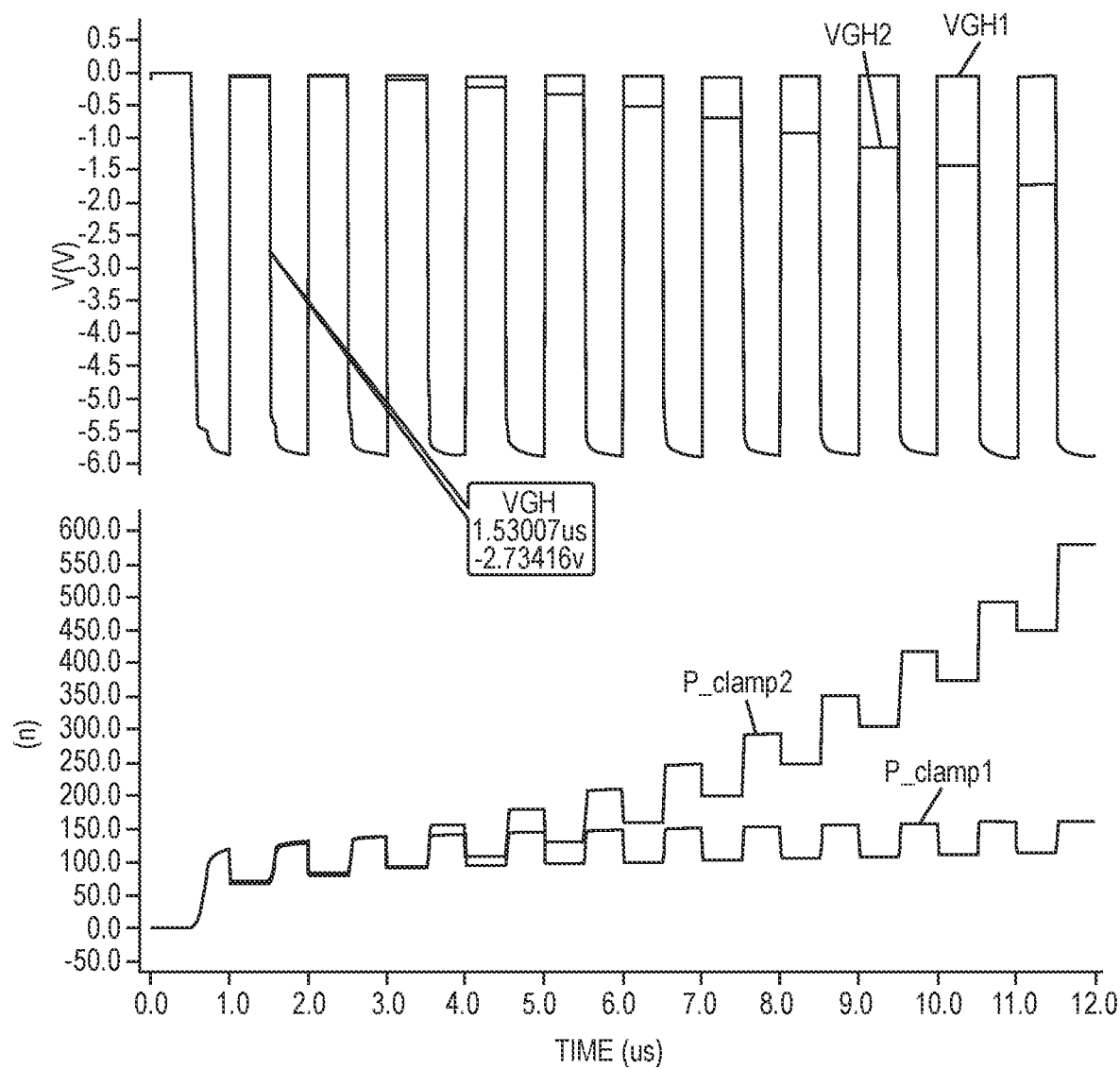
FIGS. 2 and 3 illustrate several waveforms associated with operation of the unidirectional cascode switch device.
Figure 3:
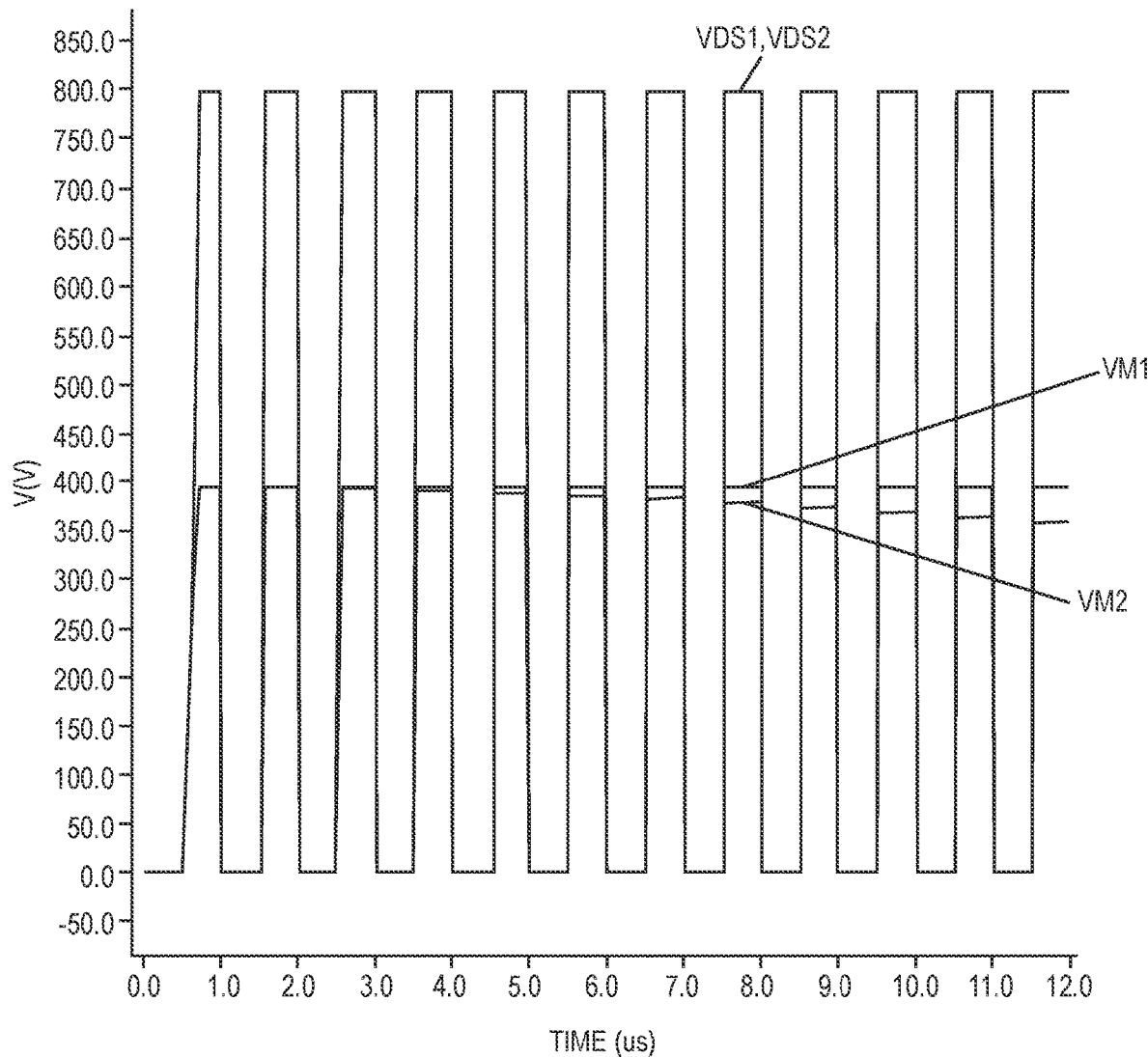

FIGS. 2 and 3 illustrate several waveforms associated with operation of the switch device 100 that includes the voltage clamp circuit 112. The upper half of FIG. 2 plots the gate voltage of the normally-on power transistor Q1 with the voltage clamp circuit 112 ('VGH1') and with a less optimal voltage clamp circuit that includes just the diodes Dcl ('VGH2'). The lower half of FIG. 2 plots the power consumption of the voltage clamp circuit 112 ('P_clamp1') and the power consumption of the less optimal voltage clamp circuit ('P_clamp2'). FIG. 3 plots the drain to source voltage and the midpoint voltage with the voltage clamp circuit 112 ('VDS1', 'VM1') and with the less optimal version of the voltage clamp circuit 112 ('VDS2', 'VM2'). The VDS and VM voltages were simulated during hard switching from 800V.

In the case of a less optimal voltage clamp circuit that includes just the diodes Dcl, the miller capacitance of the normally-off clamp transistor Q3 is ignored and the normally-off clamp transistor Q3 will experience false turn on during most dynamic switching events. Such spurious turn-on events will create additional losses as well as causing VM drift, which is shown by comparing the VGH1 waveform with the VGH2 waveform in FIG. 2 and comparing the VM1 waveform with the VM2 waveform in FIG. 3. Both the gate voltage VGH2 and the midpoint voltage VM2 continue to decrease with each switching cycle for the case of the less optimal voltage clamp circuit that includes just the diodes Dcl.

Furthermore, the power consumption P_clamp2 for the case of the less optimal voltage clamp circuit that includes just the diodes Dcl increases significantly with each switching cycles, whereas the power consumption P_clamp1 for the voltage clamp circuit 112 shown in FIG. 1 is negligible in comparison. Further simulation has shown that the power consumption P_clamp1 for the voltage clamp circuit 112 shown in FIG. 1 during hard switching at about 3 to 4 A is 4 nJ per switching cycle (~0.4 mW at 100 kHz). For soft switching, the power consumption P_clamp1 for the voltage clamp circuit 112 shown in FIG. 1 is 2 nJ per switching cycle (~1 mW at 500 kHz).

The switch device 100 in FIG. 1 further includes an overvoltage protection circuit 116 that protects the gate G1 of the normally-on power transistor Q1 from overvoltage conditions in the negative direction when the normally-off power transistor Q2 turns off. The overvoltage protection circuit 116 turns off the normally-on power transistor Q1 when the normally-off power transistor Q2 turns off, such that the cascode device formed by power transistors Q1 and Q2 is actively controlled only by the gate G2 of the normally-off power transistor Q2. Accordingly, only the normally-off gate G2 of the normally-off power transistor Q2 is actively controlled (driven) to control the cascode structure and no synchronous driving of the normally-on gate G1 of the normally-on power transistor Q1 is required.

In one embodiment, the overvoltage protection circuit 116 includes one or more diodes 'DOVP' connected in series between the gate G1 of the normally-on power transistor Q1 and the source S1 of the normally-on power transistor Q1. The number of diodes DOVP depends on the total forward voltage of the overvoltage protection circuit 116 which should be greater, in an absolute sense, than the negative threshold voltage of the normally-on power transistor Q1, to switch off the normally-on power transistor Q1. Accordingly, the overvoltage protection circuit 116 may include a single diode DOVP with the anode electrically connected to the source S1 of the normally-on power transistor Q1 and the cathode electrically connected to the gate G1 of the normally-on power transistor Q1. In the case of a plurality of series-connected diodes DOVP, e.g., as shown in FIG. 1, the anode of the first diode DOVP in the series chain is electrically connected to the source S1 of the normally-on power transistor Q1 and the cathode of the last diode DOVP in the series chain is electrically connected to the gate G1 of the normally-on power transistor Q1. The diode(s) DOVP, e.g., ESD structure(s), may be monolithically integrated in the same die 102 as the normally-on power transistor Q1, for example. The diode(s) DOVP of the overvoltage protection circuit 116 also set the gate to source voltage of the normally-on power transistor Q1 during turn off.

In one embodiment, the overvoltage protection circuit 116 may include a capacitor C2 in parallel with the one or more diodes DOVP of the overvoltage protection circuit 116. In FIG. 1, the capacitor C2 of the overvoltage protection circuit 116 is monolithically integrated in the same die 102 as the normally-on power transistor Q1, e.g., as a metal-insulator-metal capacitor structure. FIG. 1 also shows the voltage blocking capacitor C1 monolithically integrated in the same die 104 as the normally-off power transistor Q2, e.g., as a metal-insulator-metal capacitor structure.

Figure 4:
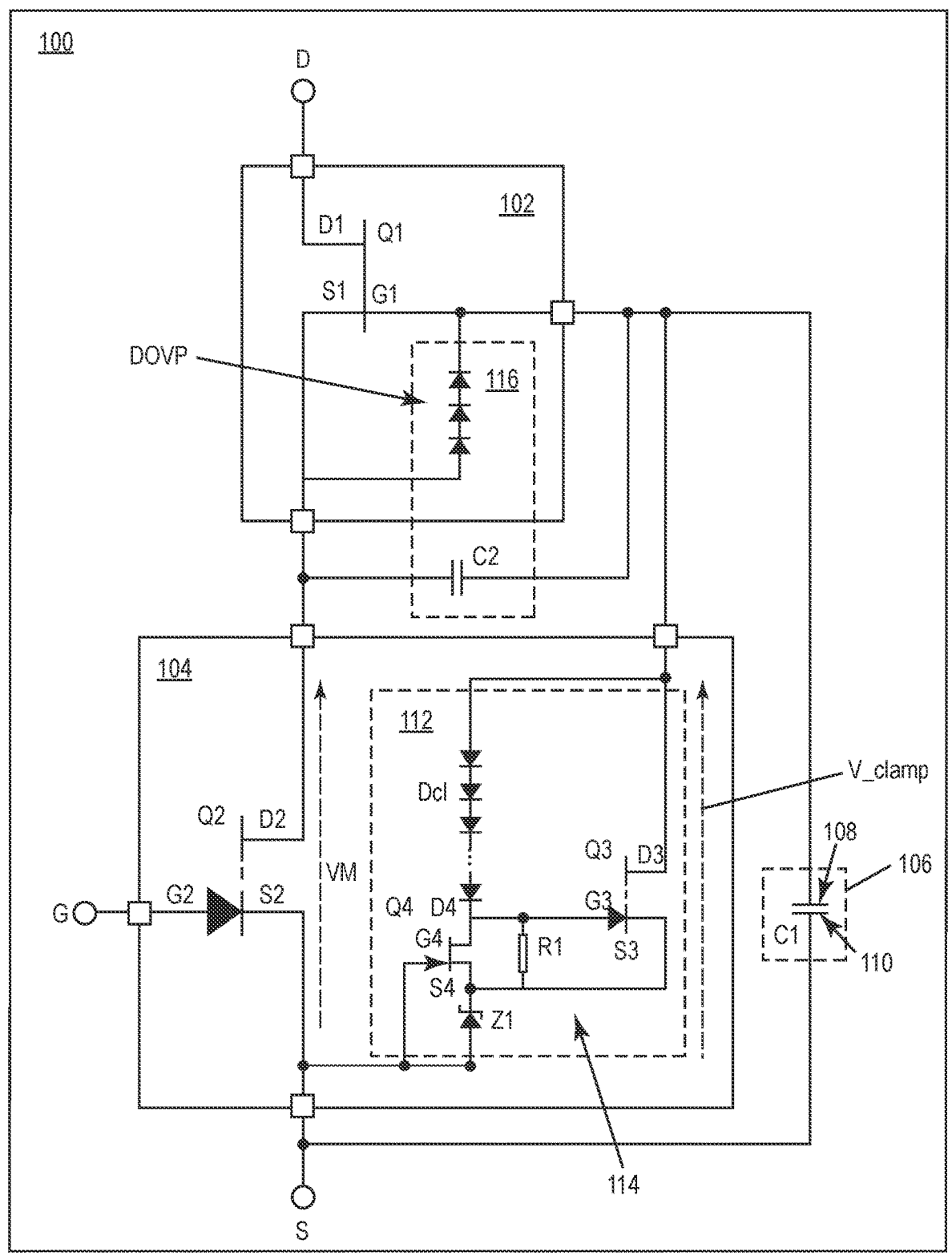
FIG. 4 illustrates a circuit schematic of another embodiment of the unidirectional cascode switch device.

FIG. 4 illustrates another embodiment of the unidirectional cascode switch device 100. The embodiment illustrated in FIG. 4 is similar to the embodiment illustrated in FIG. 1. In FIG. 4, the capacitor C2 of the overvoltage protection circuit 116 and the voltage blocking capacitor C1 are discrete components. That is, the capacitor C2 of the overvoltage protection circuit 116 and the voltage blocking capacitor C1 are external to the power transistor dies 102, 104. In this case, the capacitor C2 of the overvoltage protection circuit 116 and the voltage blocking capacitor C1 may be co-packaged with the power transistor dies 102, 104. The switch device embodiments illustrated in FIGS. 1 and 4 may be extended to three or more cascaded power transistors to yield a higher overall rated voltage for the switch device 100, where the breakdown voltage X_Q of each power transistor that forms the cascode switch device is given by X_Q=X_SW/N where X_SW is the breakdown voltage of the entire cascode switch device and N is the number of cascoded power transistors. For a single normally-on transistor cascoded with a normally-off transistor as shown in FIGS. 1 and 4, N=2 and X_Q=½*X_SW. For two normally-on transistors cascoded with a normally-off transistor, N=3 and X_Q=⅓*X_SW, etc.

Described next are embodiments of a bidirectional cascode switch device based on symmetrical and/or asymmetrical bidirectional switches. A solid-state bidirectional switch has a first source terminal, a second source terminal, a compound semiconductor substrate such as, e.g., a GaN substrate, a common drift region in the compound semiconductor substrate and in series between the two source terminals, a first gate, and a second gate. In the case of a symmetrical bidirectional switch, both gates are normally-on gates. In the case of an asymmetrical bidirectional switch, one gate is normally-on (i.e., depletion mode) and the other gate is normally-off gate (i.e., enhancement mode). For a normally-on gate, a current conduction channel is present adjacent the gate absent any voltage being applied to the gate. For a normally-off gate, a current conduction channel is not present adjacent the gate without a suitable voltage applied to the gate.

Figure 5:
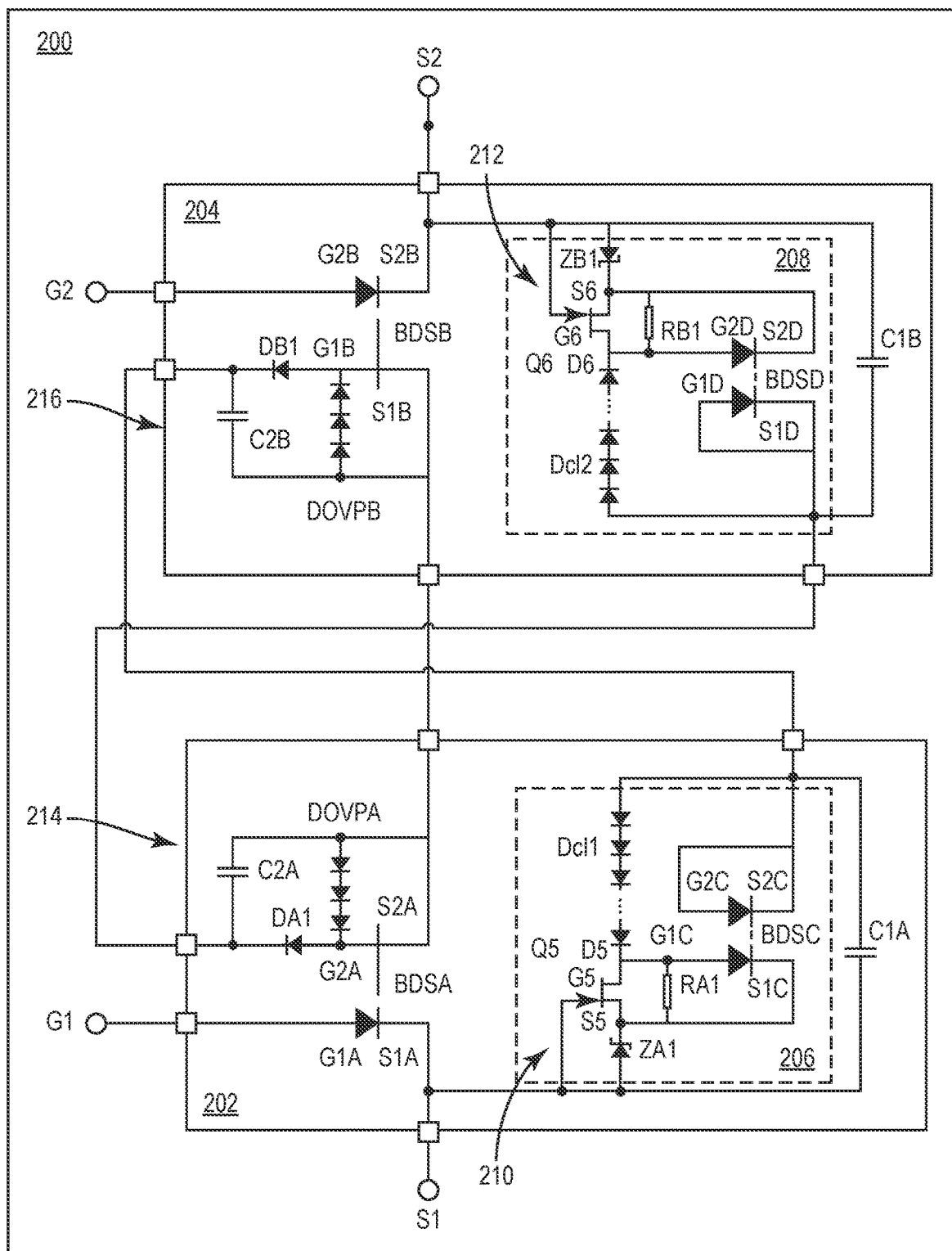
FIG. 5 illustrates a circuit schematic of an embodiment of a bidirectional cascode switch device that is based on a pair of asymmetrical bidirectional switches.

FIG. 5 illustrates an embodiment of a bidirectional cascode switch device 200 that is based on a pair of asymmetrical bidirectional switches BDSA, BDSB. The first asymmetrical bidirectional switch BDSA includes a first source S1A, a second source S2A, a normally-off gate G1A, and a normally-on gate G2A. The second asymmetrical bidirectional switch BDSB includes a first source S1B electrically connected to the second source S2A of the first asymmetrical bidirectional switch BDSA to form a cascode device, a second source S2B, a normally-off gate G2B, and a normally-on gate G1B.

The asymmetrical bidirectional switches BDSA, BDSB may be provided as discrete dies 202, 204. For example, the first asymmetrical bidirectional switch BDSA may be included in a first GaN die 202 and have at most half (½) the maximum rated source-to-source (S2B-to-S1A) voltage as the bidirectional cascode switch device 200. The second asymmetrical bidirectional switch BDSB may be included in a second GaN die 204 and have at most half (½) the maximum rated source-to-source voltage as the bidirectional cascode switch device 200. The maximum rated source-to-source voltage of the bidirectional cascode switch device 200 may be 800V or higher, e.g., 1.2 kV or higher. The asymmetrical bidirectional switches BDSA, BDSB instead may be monolithically integrated in the same die. In either case, the common drift region/compound semiconductor substrate of the asymmetrical bidirectional switches BDSA, BDSB are electrically isolated from one another to ensure each asymmetrical bidirectional switch BDSA, BDSB can safely block its own individual voltage.

The bidirectional cascode switch device 200 also includes a first capacitor C1A electrically connected between the normally-on gate G1B of the second bidirectional power switch BDSB and the first source S1A of the first bidirectional power switch BDSA. A second capacitor C1B is electrically connected between the normally-on gate G2A of the first bidirectional power switch BDSA and the second source S2B of the second bidirectional power switch BDSB.

The first power transistor die 202 further includes a first voltage clamp circuit 206 that comprises a first bidirectional clamp switch BDSC and one or more diodes Dcl1. The first bidirectional clamp switch BDSC has a first gate G1C, a second gate G2C, a first source S1C electrically connected to the first source S1A of the first bidirectional power switch, and a second source S2C electrically connected to the normally-on gate G1B of the second bidirectional power switch BDSB. The one or more diodes Dcl1 of the first voltage clamp circuit 206 are electrically connected between the first gate G1C and the second source S2C of the first bidirectional clamp switch BDSC.

The second power transistor die 204 further includes a second voltage clamp circuit 208 that comprises a second bidirectional clamp switch BDSD and one or more diodes Dcl2. The second bidirectional clamp switch has a first gate G1D, a second gate G1D, a first source S1D electrically connected to the normally-on gate G2A of the first bidirectional power switch BDSA, and a second source S2D electrically connected to the second source S2B of the second bidirectional power switch BDSB. The one or more diodes Dcl1 of the second voltage clamp circuit 208 are electrically connected between the second gate G2D and the first source S1D of the second bidirectional clamp switch BDSD.

The first voltage clamp circuit 206 may further include a first pulldown device 210 that prevents turn on of the first bidirectional clamp switch BDSC during dynamic switching of the switch device 200. The second voltage clamp circuit 208 may likewise include a second pulldown device 212 that prevents turn on of the second bidirectional clamp switch BDSD during dynamic switching of the switch device 200.

In one embodiment, the first pulldown device 210 includes a first normally-on pulldown transistor Q5 and a first voltage clamp ZA1. The first normally-on pulldown transistor Q5 has a drain D5 electrically connected to the first gate G1C of the first bidirectional clamp switch BDSC, a source S5 electrically connected to the first source S1C of the first bidirectional clamp switch BDSC, and a gate G5 electrically connected to the first source S1A of the first bidirectional power switch BDSA. The first voltage clamp ZA1 of the first pulldown device 210 is electrically connected between the source S5 of the first normally-on pulldown transistor Q5 and the first source S1A of the first bidirectional power switch BDSA.

The second pulldown device 212 may likewise include a second normally-on pulldown transistor Q6 and a second voltage clamp ZB1. The second normally-on pulldown transistor Q6 has a drain D6 electrically connected to the second gate S2D of the second bidirectional clamp switch BDSD, a source S6 electrically connected to the second source S2D of the second bidirectional clamp switch BDSD, and a gate G6 electrically connected to the second source S2B of the second bidirectional power switch BDSB. The second voltage clamp ZB1 of the second pulldown device 212 is electrically connected between the source S6 of the second normally-on pulldown transistor Q6 and the second source S2B of the second bidirectional power switch BDSB.

The first pulldown device 210 may further include a resistor RA1 electrically connected between the first gate G1C and the first source S1C of the first bidirectional clamp switch BDSC. The second pulldown device 212 may likewise further include a resistor RB1 electrically connected between the second gate G2D and the second source S2D of the second bidirectional clamp switch BDSD.

The bidirectional cascode switch device 200 in FIG. 5 also includes a first overvoltage protection circuit 214 and a second overvoltage protection circuit 216. The first overvoltage protection circuit 214 turns off the normally-on gate G2A of the first bidirectional power switch BDSA when the normally-off gate G2B of the second bidirectional power switch BDSB turns off, such that the normally-on gate G2A of the first bidirectional power switch BDSA is passively controlled by the normally-off gate G2B of the second bidirectional power switch BDSB. The second overvoltage protection circuit 216 similarly turns off the normally-on gate G1B of the second bidirectional power switch BDSB when the normally-off gate G1A of the first bidirectional power switch BDSA turns off, such that the normally-on gate G1B of the second bidirectional power switch BDSB is passively controlled by the normally-off gate G1A of the first bidirectional power switch BDSA.

In one embodiment, the first overvoltage protection circuit 214 includes one or more diodes DOVPA in series between the normally-on gate G2A and the second source S2A of the first bidirectional power switch BDSA. The anode of a first one of the one or more diodes DOVPA of the first overvoltage protection circuit 214 is electrically connected to the second source S2A of the first bidirectional power switch BDSA. The cathode of a last one of the one or more diodes DOVPA of the first overvoltage protection circuit 214 is electrically connected to the normally-on gate G2A of the first bidirectional power switch BDSA. A capacitor C2A may be in parallel with the one or more diodes DOVPA of the first overvoltage protection circuit 214.

The second overvoltage protection circuit 216 may similarly include one or more diodes DOVPD in series between the normally-on gate G1B and the first source S1B of the second bidirectional power switch BDSB. The anode of a first one of the one or more diodes DOVPD of the second overvoltage protection circuit 216 is electrically connected to the first source S1B of the second bidirectional power switch BDSB. The cathode of a last one of the one or more diodes DOVPD of the second overvoltage protection circuit 216 is electrically connected to the normally-on gate G1B of the second bidirectional power switch BDSB. A capacitor C2B may be in parallel with the one or more diodes DOVPB of the second overvoltage protection circuit 216.

The first overvoltage protection circuit 214 may further include an additional diode DA1 having an anode electrically connected to the cathode of the last one of the one or more diodes DOVPA of the first overvoltage protection circuit 214 and a cathode electrically connected to the anode of the first one of the one or more diodes DOVPA of the first overvoltage protection circuit 214. The second overvoltage protection circuit 216 may similarly include an additional diode DB1 having an anode electrically connected to the cathode of the last one of the one or more diodes DOVPB of the second overvoltage protection circuit 216 and a cathode electrically connected to the anode of the first one of the one or more diodes DOVPD of the second overvoltage protection circuit 216.

In FIG. 5, the first gate G1C and the second gate G2C of the first bidirectional clamp switch BDSC are both normally-off gates. The first gate G1D and the second gate G2D of the second bidirectional clamp switch BDSD are also both normally-off gates.

Figure 6:
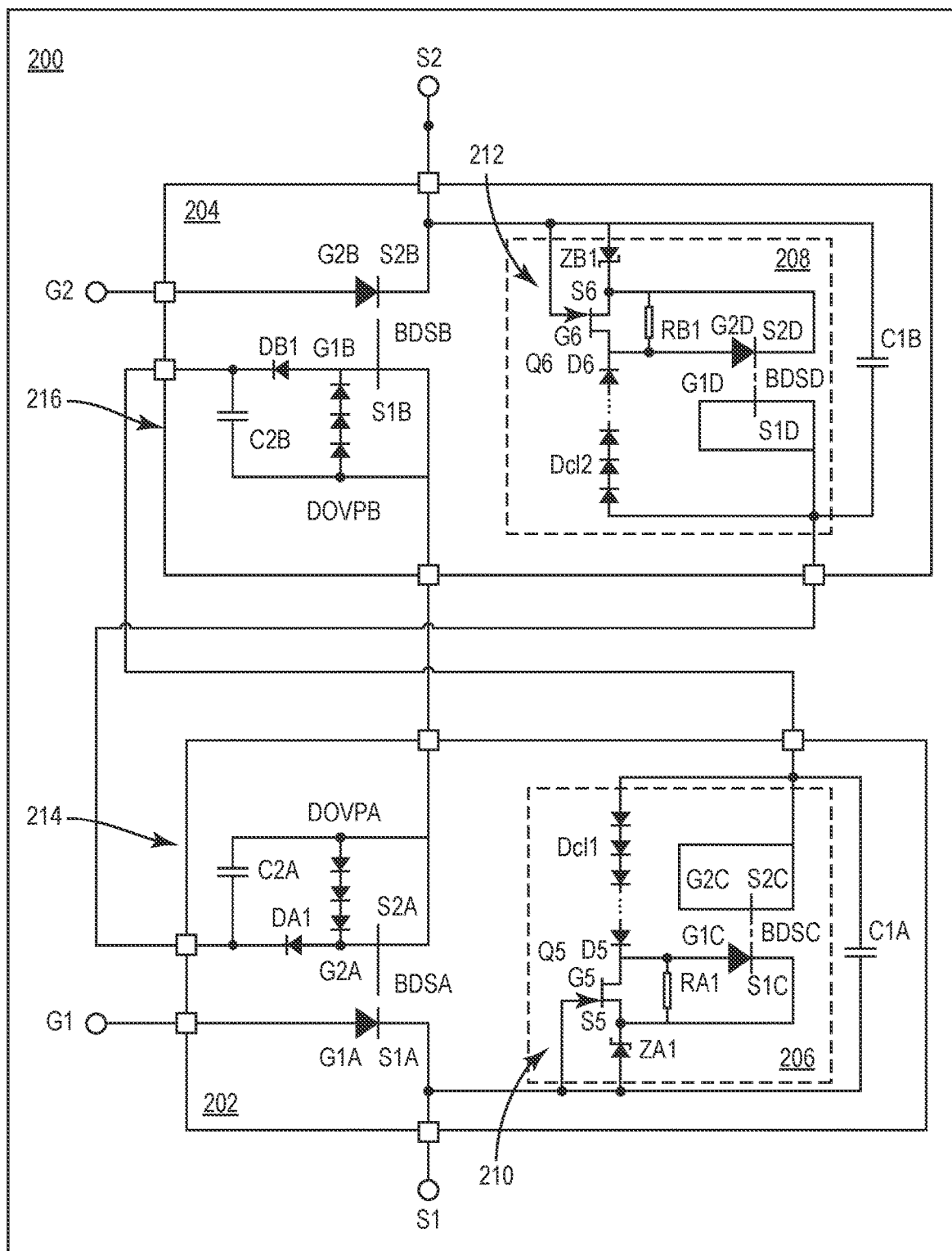
FIG. 6 illustrates a circuit schematic of another embodiment of the bidirectional cascode switch device.

FIG. 6 illustrates another embodiment of the bidirectional cascode switch device 200. The embodiment illustrated in FIG. 6 is similar to the embodiment illustrated in FIG. 5. In FIG. 6, the first gate G1C of the first bidirectional clamp switch BDSC is a normally-off gate and the second gate G2C of the first bidirectional clamp switch BDSC is a normally-on gate. Similarly, the first gate G1D of the second bidirectional clamp switch BDSD is a normally-on gate and the second gate G2D of the second bidirectional clamp switch BDSD is a normally-off gate.

The bidirectional power switches BDSA, BDSB that form the bidirectional cascode switch device 200 shown in FIGS. 5 and 6 may be provided as discrete dies 202, 204. For example, each bidirectional power switch BDSA, BDSB may be included in a separate GaN die 202, 204 and have at most half (½) of the maximum rated source-to-source (S2B-to-S1A) voltage of the switch device 200. The maximum rated source-to-source (S2B-to-S1A) voltage of the switch device 200 may be 800V or higher, e.g., 1.8 kV or higher.

The capacitors C1A, C1B, C2A, C2B and the voltage clamp circuits 206, 208 are shown as being integrated in the corresponding power transistor die 202, 204 in FIGS. 5 and 6. However, the capacitors C1A, C1B, C2A, C2B instead may be external components that are co-packaged with the power transistor dies 202, 204.

Both stacked asymmetrical bidirectional power switches BDSA, BDSB in FIGS. 5 and 6 are used to block the entire (e.g., 800V or higher) source-to-source voltage of the bidirectional cascode switch device 200, with 100% utilisation of both devices BDSA, BDSB at all times. Furthermore, only two active gates G1A, G2B are required to fully operate the bidirectional cascode switch device 200. The bidirectional cascode switch device approach can be further extended to provide higher blocking voltage capability, as described next in more detail.

More generally, the bidirectional cascode switch device approach uses at least two bidirectional power switches electrically connected in a cascode configuration, with a first bidirectional power switch (e.g., BDSA in FIGS. 5 and 6) and a second bidirectional power switch (e.g., BDSB in FIGS. 5 and 6) of the at least two bidirectional switches each having a normally-on gate and a normally-off gate. Any remaining bidirectional power switch cascoded between the first bidirectional power switch and the second bidirectional power switch has a first normally-on gate and a second normally-on gate. The bidirectional cascode switch device 200 is actively controlled by the normally-off gate (e.g., G1A in FIGS. 5 and 6) of the first bidirectional power switch (e.g., BDSA in FIGS. 5 and 6) and the normally-off gate (e.g., G2B in FIGS. 5 and 6) of the second bidirectional power switch (e.g., BDSB in FIGS. 5 and 6). Each normally-on gate (e.g., G2A and G1B in FIGS. 5 and 6) of the at least two bidirectional power switches is electrically connected to a source of another one of the at least two bidirectional power switches by an overvoltage protection circuit (e.g., 214 and 216 in FIGS. 5 and 6) that blocks a portion of the source-to-source (e.g., S2B-to-S1A in FIGS. 5 and 6) voltage across the bidirectional cascode switch device 200 when the switch device 200 is off.

Described next is an embodiment of a bidirectional cascode switch device based on symmetrical bidirectional power switches and low-voltage (e.g., 20V) MOS devices.

Figure 7:
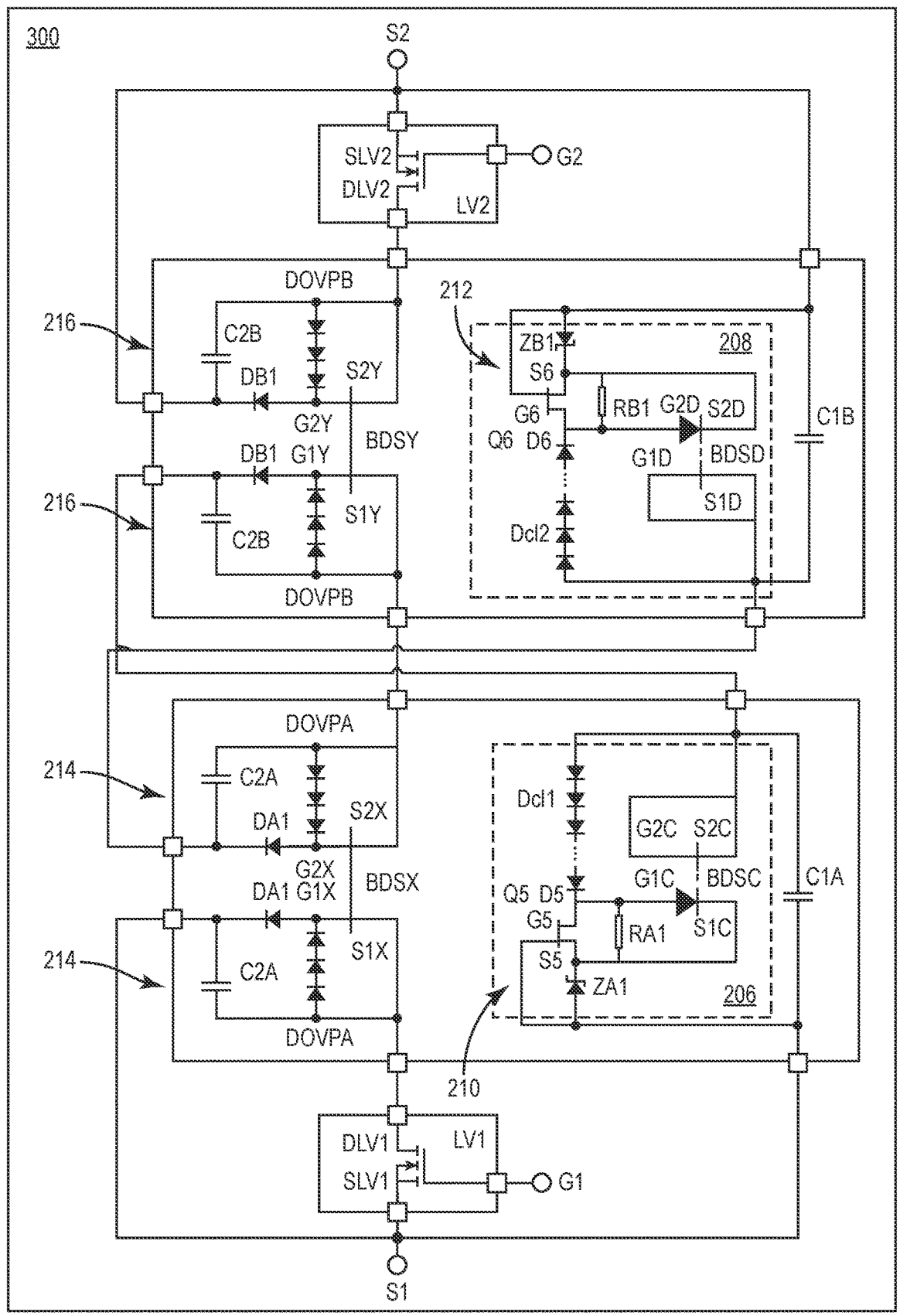
FIG. 7 illustrates a circuit schematic of an embodiment of a bidirectional cascode switch device that is based on symmetrical bidirectional power switches stacked between low-voltage MOS switch devices in a cascode configuration.

FIG. 7 illustrates an embodiment of a bidirectional cascode switch device 300 that is based on symmetrical bidirectional power switches BDSX, BDSY stacked between low-voltage MOS switch devices LV1, LV2 in a cascode configuration. The low-voltage MOS switch devices LV1, LV2 are normally off switches in that both low-voltage MOS switch devices LV1, LV2 are enhancement mode devices. The normally-off MOS switch devices LV1, LV2 in FIG. 7 are referred to as 'low-voltage' because the normally-off MOS switch devices LV1, LV2 have a lower breakdown voltage (e.g., 20V) compared to the symmetrical bidirectional power switches BDSX, BDSY which may be 650V rated GaN devices, for example.

The at least two bidirectional power switches BDSX, BDSY are electrically connected in a cascode configuration between the first normally-off MOS switch device LV1 and the second normally-off MOS switch device LV2. Each bidirectional power switch BDSX, BDSY has a first normally-on gate G1X, G1Y and a second normally-on gate G2X, G2Y, and therefore considered to be symmetrical.

The first source S1X of the first bidirectional power switch BDSX is electrically connected to the drain DLV1 of the first normally-off MOS switch device LV1. The first normally-on gate G1X of the first bidirectional power switch BDSX is electrically connected to the source SLV1 of the first normally-off MOS switch device LV1.

The first source S1Y of the second bidirectional power switch BDSY is electrically connected to the second source S2X of the first bidirectional power switch BDSX to form the cascode device. The second source S2Y of the second bidirectional power switch BDSY is electrically connected to the drain DLV2 of the second normally-off MOS switch device LV2. The second normally-on gate S2Y of the second bidirectional power switch BDSY is electrically connected to the source SLV2 of the normally-off MOS switch device LV2.

A first capacitor C1A is electrically connected between the source SLV1 of the first normally-off MOS switch device LV1 and the first normally-on gate G1Y of the second bidirectional power switch BDSY. A second capacitor C1B is electrically connected between the second normally-on gate G2X of the first bidirectional power switch BDSX and the source SLV2 of the second normally-off MOS switch device LV2.

A first voltage clamp circuit 206, which may be monolithically integrated with the first bidirectional power switch BDSX, includes a first bidirectional clamp switch BDSC and one or more diodes Dcl1. The first bidirectional clamp switch BDSC has a first gate G1C, a second gate G1C, a first source S1C electrically connected to the source SLV1 of the first normally-off MOS switch device LV1, and a second source S2C electrically connected to the first normally-on gate G1Y of the second bidirectional power switch BDSY. The one or more diodes Dcl1 of the first voltage clamp circuit 206 are electrically connected between the first gate G1C and the second source S2C of the first bidirectional clamp switch BDSC.

A second voltage clamp circuit 208, which may be monolithically integrated with the second bidirectional power switch BDSY, includes a second bidirectional clamp switch BDSD and one or more diodes Dcl2. The second bidirectional clamp switch BDSD has a first gate G1D, a second gate G2D, a first source S1D electrically connected to the second normally-on gate G2X of the first bidirectional power switch BDSX, and a second source S2D electrically connected to the source SLV2 of the second normally-off MOS switch device LV2. The one or more diodes Dcl2 of the second voltage clamp circuit 208 are electrically connected between the second gate G2D and the first source S1D of the second bidirectional clamp switch BDSD.

The gates G1C, G2C of the first bidirectional clamp switch BDSC and the gates G1D, G2D of the second bidirectional clamp switch BDSD are each a normally-off gate, e.g., as described previously herein in connection with FIG. 5. Accordingly, the first and second bidirectional clamp switches BDSC, BDSD shown in FIG. 7 are considered symmetrical. However, the first and second bidirectional clamp switches BDSC, BDSD instead may be asymmetrical. For example, the first gate G1C of the first bidirectional clamp switch BDSC and the second gate G2D of the second bidirectional clamp switch BDSD may be normally-off gates whereas the second gate G2C of the first bidirectional clamp switch BDSC and the first gate G1D of the second bidirectional clamp switch BDSD may be normally-on gates, e.g., as described previously herein in connection with FIG. 6.

As previously explained herein, the first voltage clamp circuit 206 may further include a first pulldown device 210 that prevents turn on of the first bidirectional clamp switch BDSC during dynamic switching of the switch device 300. The second voltage clamp circuit 208 may likewise further include a second pulldown device 212 that prevents turn on of the second bidirectional clamp switch BDSD during dynamic switching of the switch device 300.

In one embodiment, the first pulldown device 210 includes a first normally-on pulldown transistor Q5 and a first voltage clamp ZA1. The first normally-on pulldown transistor Q5 has a drain D5 electrically connected to the first gate G1C of the first bidirectional clamp switch BDSC, a source S5 electrically connected to the first source S1C of the first bidirectional clamp switch BDSC, and a gate G5 electrically connected to the source SLV1 of the first normally-off MOS switch device LV1. The first voltage clamp ZA1 of the first pulldown device 210 is electrically connected between the source S5 of the first normally-on pulldown transistor Q5 and the source SLV1 of the first normally-off MOS switch device LV1. The first pulldown device may further include a resistor RA1 electrically connected between the first gate G1C and the first source S1C of the first bidirectional clamp switch BDSC.

The second pulldown device 212 may similarly include a second normally-on pulldown transistor Q6 and a second voltage clamp ZB1. The second normally-on pulldown transistor Q6 has a drain D6 electrically connected to the second gate G2D of the second bidirectional clamp switch BDSD, a source S6 electrically connected to the second source S2D of the second bidirectional clamp switch BDSD, and a gate G6 electrically connected to the source SLV2 of the second normally-off MOS switch device LV2. The second voltage clamp ZB1 of the second pulldown device 212 is electrically connected between the source S6 of the second normally-on pulldown transistor Q6 and the source SLV2 of the second normally-off MOS switch device LV2. The second pulldown device 212 may further include a resistor RB1 electrically connected between the second gate G2D and the second source S2D of the second bidirectional clamp switch BDSD.

The bidirectional cascode switch device 300 in FIG. 7 may further include the first overvoltage protection circuit 214 previously described herein for both normally-on gates G1X, G2X of the first bidirectional power switch BDSX and the second overvoltage protection circuit 216 for both normally-on gates G1Y, G2Y of the second bidirectional power switch BDSY.

Different than the embodiments in FIGS. 5 and 6 which use stacked asymmetrical bidirectional power switches BDSA, BDSB, the embodiment illustrated FIG. 7 uses stacked symmetrical bidirectional power switches BDSX, BDSY both having a pair of normally-on gates G1X/G2X, G1Y/G2Y. In FIG. 7, the first source S1X of the first bidirectional power switch BDSX is electrically connected to the first normally-off MOS switch device LV1 to form a separate cascode device from the main cascode, to enable normally off function. Likewise, the second source S2Y of the second bidirectional power switch BDSY is electrically connected to the second normally-off MOS switch device LV2 to enable normally off function.

Also different than the embodiments illustrated in FIGS. 5 and 6, the source of both voltage clamp circuits 206, 208 are electrically connected to the source SLV1, SLV2 of the respective normally-off MOS switch device LV1, LV2 and not directly coupled to any of the terminals of the symmetrical bidirectional power switch BDSX, BDSY included in the same die where the die terminals are indicated by squares in each of FIGS. 1 and 4 through 7. Depending on the semiconductor technology used to fabricate the bidirectional power switches BDSX, BDSY and the normally-off MOS switch devices LV1, LV2, the normally-off MOS switch devices LV1, LV2 may or may not be integrated in the same die as the corresponding bidirectional power switch BDSX, BDSY.

FIG. 7 shows the first normally-off MOS switch device LV1 implemented in a different die as the first bidirectional power switch BDSX and the second normally-off MOS switch device LV2 implemented in a different die as the second bidirectional power switch BDSY. However, the first normally-off MOS switch device LV1 instead may be integrated with the first bidirectional power switch BDSX in the same (first) die and the second normally-off MOS switch device LV2 may be integrated with the second bidirectional power switch BDSX in the same (second) die.

Although the present disclosure is not so limited, the following numbered examples demonstrate one or more aspects of the disclosure.

Example 1. A switch device, comprising: a first power transistor die that includes a normally-on power transistor having at most half a maximum rated drain-to-source voltage as the switch device; a second power transistor die that includes a normally-off power transistor having at most half the maximum rated drain-to-source voltage as the switch device, wherein a drain of the normally-off power transistor is electrically connected to a source of the normally-on power transistor to form a cascode device; and a first capacitor electrically connected between a gate of the normally-on power transistor and a source of the normally-off power transistor, wherein the second power transistor die further includes a voltage clamp circuit comprising a normally-off clamp transistor having a drain electrically connected to the gate of the normally-on power transistor and a source electrically connected to the source of the normally-off power transistor, and one or more diodes between the drain and a gate of the normally-off clamp transistor.

Example 2. The switch device of example 1, wherein the normally-on power transistor is a normally-on GaN transistor, wherein the normally-off power transistor is a normally-off GaN transistor, and wherein the maximum rated drain-to-source voltage of the switch device is 800V or higher.

Example 3. The switch device of example 1 or 2, wherein the voltage clamp circuit further comprises a pulldown device configured to prevent turn on of the normally-off clamp transistor during dynamic switching of the switch device.

Example 4. The switch device of example 3, wherein the pulldown device comprises: a normally-on pulldown transistor having a drain electrically connected to the gate of the normally-off clamp transistor, a source electrically connected to the source of the normally-off clamp transistor, and a gate electrically connected to the source of the normally-off power transistor; and a voltage clamp between the source of the normally-on pulldown transistor and the source of the normally-off power transistor.

Example 5. The switch device of example 4, wherein the pulldown device further comprises: a resistor electrically connected between the gate and the source of the normally-off clamp transistor.

Example 6. The switch device of any of examples 1 through 5, further comprising an overvoltage protection circuit configured to turn off the normally-on power transistor when the normally-off power transistor turns off, such that the cascode device is actively controlled only by a gate of the normally-off power transistor.

Example 7. The switch device of example 6, wherein the overvoltage protection circuit comprises one or more diodes in series between the gate and the source of the normally-on power transistor, wherein an anode of a first one of the one or more diodes of the overvoltage protection circuit is electrically connected to the source of the normally-on power transistor, and wherein a cathode of a last one of the one or more diodes of the overvoltage protection circuit is electrically connected to the gate of the normally-on power transistor.

Example 8. The switch device of example 7, further comprising: a capacitor in parallel with the one or more diodes of the overvoltage protection circuit.

Example 9. A switch device, comprising: a first power transistor die that includes a first bidirectional power switch comprising a first source, a second source, a normally-off gate, and a normally-on gate; a second power transistor die that includes a second bidirectional power switch comprising a first source electrically connected to the second source of the first bidirectional power switch to form a cascode device, a second source, a normally-off gate, and a normally-on gate; a first capacitor electrically connected between the normally-on gate of the second bidirectional power switch and the first source of the first bidirectional power switch; and a second capacitor electrically connected between the normally-on gate of the first bidirectional power switch and the second source of the second bidirectional power switch, wherein the first power transistor die further includes a first voltage clamp circuit comprising a first bidirectional clamp switch having a first gate, a second gate, a first source electrically connected to the first source of the first bidirectional power switch, and a second source electrically connected to the normally-on gate of the second bidirectional power switch, and one or more diodes between the first gate and the second source of the first bidirectional clamp switch, wherein the second power transistor die further includes a second voltage clamp circuit comprising a second bidirectional clamp switch having a first gate, a second gate, a first source electrically connected to the normally-on gate of the first bidirectional power switch, and a second source electrically connected to the second source of the second bidirectional power switch, and one or more diodes between the second gate and the first source of the second bidirectional clamp switch.

Example 10. The switch device of example 9, wherein the first power transistor die is a first GaN die and the first bidirectional power switch has at most half a maximum rated source-to-source voltage as the switch device, wherein the second power transistor die is a second GaN die and the second bidirectional power switch has at most half the maximum rated source-to-source voltage as the switch device, and wherein the maximum rated source-to-source voltage of the switch device is 800V or higher.

Example 11. The switch device of example 9 or 10, wherein the first voltage clamp circuit further comprises a first pulldown device configured to prevent turn on of the first bidirectional clamp switch during dynamic switching of the switch device, and wherein the second voltage clamp circuit further comprises a second pulldown device configured to prevent turn on of the second bidirectional clamp switch during dynamic switching of the switch device.

Example 12. The switch device of example 11, wherein the first pulldown device comprises: a first normally-on pulldown transistor having a drain electrically connected to the first gate of the first bidirectional clamp switch, a source electrically connected to the first source of the first bidirectional clamp switch, and a gate electrically connected to the first source of the first bidirectional power switch; and a first voltage clamp between the source of the first normally-on pulldown transistor and the first source of the first bidirectional power switch, wherein the second pulldown device comprises: a second normally-on pulldown transistor having a drain electrically connected to the second gate of the second bidirectional clamp switch, a source electrically connected to the second source of the second bidirectional clamp switch, and a gate electrically connected to the second source of the second bidirectional power switch; and a second voltage clamp between the source of the second normally-on pulldown transistor and the second source of the second bidirectional power switch.

Example 13. The switch device of example 12, wherein the first pulldown device further comprises a resistor electrically connected between the first gate and the first source of the first bidirectional clamp switch, and wherein the second pulldown device further comprises a resistor electrically connected between the second gate and the second source of the second bidirectional clamp switch.

Example 14. The switch device of any of examples 9 through 13, further comprising: a first overvoltage protection circuit configured to turn off the normally-on gate of the first bidirectional power switch when the normally-off gate of the second bidirectional power switch turns off, such that the normally-on gate of the first bidirectional power switch is passively controlled by the normally-off gate of the second bidirectional power switch; and a second overvoltage protection circuit configured turn off the normally-on gate of the second bidirectional power switch when the normally-off gate of the first bidirectional power switch turns off, such that the normally-on gate of the second bidirectional power switch is passively controlled by the normally-off gate of the first bidirectional power switch.

Example 15. The switch device of example 14, wherein the first overvoltage protection circuit comprises one or more diodes in series between the normally-on gate and the second source of the first bidirectional power switch, an anode of a first one of the one or more diodes of the first overvoltage protection circuit is electrically connected to the second source of the first bidirectional power switch, and a cathode of a last one of the one or more diodes of the first overvoltage protection circuit is electrically connected to the normally-on gate of the first bidirectional power switch, wherein the second overvoltage protection circuit comprises one or more diodes in series between the normally-on gate and the first source of the second bidirectional power switch, an anode of a first one of the one or more diodes of the second overvoltage protection circuit is electrically connected to the first source of the second bidirectional power switch, and a cathode of a last one of the one or more diodes of the second overvoltage protection circuit is electrically connected to the normally-on gate of the second bidirectional power switch.

Example 16. The switch device of example 15, wherein the first overvoltage protection circuit further comprises an additional diode having an anode electrically connected to the cathode of the last one of the one or more diodes of the first overvoltage protection circuit and a cathode electrically connected to the anode of the first one of the one or more diodes of the first overvoltage protection circuit, wherein the second overvoltage protection circuit further comprises an additional diode having an anode electrically connected to the cathode of the last one of the one or more diodes of the second overvoltage protection circuit and a cathode electrically connected to the anode of the first one of the one or more diodes of the second overvoltage protection circuit.

Example 17. The switch device of example 15 or 16, further comprising: a first capacitor in parallel with the one or more diodes of the first overvoltage protection circuit; and a second capacitor in parallel with the one or more diodes of the second overvoltage protection circuit.

Example 18. The switch device of any of examples 9 through 17, wherein the first gate and the second gate of the first bidirectional clamp switch are both normally-off gates, and wherein the first gate and the second gate of the second bidirectional clamp switch are both normally-off gates.

Example 19. The switch device of any of examples 9 through 17, wherein the first gate of the first bidirectional clamp switch is a normally-off gate and the second gate of the first bidirectional clamp switch is a normally-on gate, and wherein the first gate of the second bidirectional clamp switch is a normally-on gate and the second gate of the second bidirectional clamp switch is a normally-off gate.

Example 20. A switch device, comprising: a first normally off switch; a second normally-off switch; a first bidirectional power switch comprising a first source electrically connected to a drain of the first normally off switch, a second source, a first normally-on gate electrically connected to a source of the first normally off switch, and a second normally-on gate; a second bidirectional power switch comprising a first source electrically connected to the second source of the first bidirectional power switch to form a cascode device, a second source electrically connected to a drain of the second normally off switch, a first normally-on gate, and a second normally-on gate electrically connected to a source of the second normally off switch; a first capacitor electrically connected between the source of the first normally off switch and the first normally-on gate of the second bidirectional power switch; a second capacitor electrically connected between the second normally-on gate of the first bidirectional power switch and the source of the second normally off switch; a first voltage clamp circuit comprising a first bidirectional clamp switch having a first gate, a second gate, a first source electrically connected to the source of the first normally off switch, and a second source electrically connected to the first normally-on gate of the second bidirectional power switch, and one or more diodes between the first gate and the second source of the first bidirectional clamp switch; and a second voltage clamp circuit comprising a second bidirectional clamp switch having a first gate, a second gate, a first source electrically connected to the second normally-on gate of the first bidirectional power switch, and a second source electrically connected to the source of the second normally off switch, and one or more diodes between the second gate and the first source of the second bidirectional clamp switch.

Example 21. The switch device of example 20, wherein the first voltage clamp circuit further comprises a first pulldown device configured to prevent turn on of the first bidirectional clamp switch during dynamic switching of the switch device, and wherein the second voltage clamp circuit further comprises a second pulldown device configured to prevent turn on of the second bidirectional clamp switch during dynamic switching of the switch device.

Example 22. The switch device of example 21, wherein the first pulldown device comprises: a first normally-on pulldown transistor having a drain electrically connected to the first gate of the first bidirectional clamp switch, a source electrically connected to the first source of the first bidirectional clamp switch, and a gate electrically connected to the source of the first normally off switch; and a first voltage clamp between the source of the first normally-on pulldown transistor and the source of the first normally off switch, wherein the second pulldown device comprises: a second normally-on pulldown transistor having a drain electrically connected to the second gate of the second bidirectional clamp switch, a source electrically connected to the second source of the second bidirectional clamp switch, and a gate electrically connected to the source of the second normally off switch; and a second voltage clamp between the source of the second normally-on pulldown transistor and the source of the second normally off switch.

Example 23. The switch device of example 22, wherein the first pulldown device further comprises a resistor electrically connected between the first gate and the first source of the first bidirectional clamp switch, and wherein the second pulldown device further comprises a resistor electrically connected between the second gate and the second source of the second bidirectional clamp switch.

As used herein, the terms "having," "containing," "including," "comprising," and the like are open-ended terms that indicate the presence of stated elements or features, but do not preclude additional elements or features. The articles "a," "an" and "the" are intended to include the plural as well as the singular, unless the context clearly indicates otherwise.

The expression "and/or" should be interpreted to include all possible conjunctive and disjunctive combinations, unless expressly noted otherwise. For example, the expression "A and/or B" should be interpreted to mean only A, only B, or both A and B. The expression "at least one of" should be interpreted in the same manner as "and/or", unless expressly noted otherwise. For example, the expression "at least one of A and B" should be interpreted to mean only A, only B, or both A and B.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A switch device, comprising:
    a first power transistor die that includes a normally-on power transistor having at most half a maximum rated drain-to-source voltage as the switch device;
    a second power transistor die that includes a normally-off power transistor having at most half the maximum rated drain-to-source voltage as the switch device, wherein a drain of the normally-off power transistor is electrically connected to a source of the normally-on power transistor to form a cascode device; and
    a first capacitor electrically connected between a gate of the normally-on power transistor and a source of the normally-off power transistor,
    wherein the second power transistor die further includes a voltage clamp circuit comprising a normally-off clamp transistor having a drain electrically connected to the gate of the normally-on power transistor and a source electrically connected to the source of the normally-off power transistor, and one or more diodes between the drain and a gate of the normally-off clamp transistor.

2. The switch device of claim 1, wherein the normally-on power transistor is a normally-on GaN transistor, wherein the normally-off power transistor is a normally-off GaN transistor, and wherein the maximum rated drain-to-source voltage of the switch device is 800V or higher.

3. The switch device of claim 1, wherein the voltage clamp circuit further comprises a pulldown device configured to prevent turn on of the normally-off clamp transistor during dynamic switching of the switch device.

4. The switch device of claim 3, wherein the pulldown device comprises:
    a normally-on pulldown transistor having a drain electrically connected to the gate of the normally-off clamp transistor, a source electrically connected to the source of the normally-off clamp transistor, and a gate electrically connected to the source of the normally-off power transistor; and
    a voltage clamp between the source of the normally-on pulldown transistor and the source of the normally-off power transistor.

5. The switch device of claim 4, wherein the pulldown device further comprises:
    a resistor electrically connected between the gate and the source of the normally-off clamp transistor.

6. The switch device of claim 1, further comprising an overvoltage protection circuit configured to turn off the normally-on power transistor when the normally-off power transistor turns off, such that the cascode device is actively controlled only by a gate of the normally-off power transistor.

7. The switch device of claim 6, wherein the overvoltage protection circuit comprises one or more diodes in series between the gate and the source of the normally-on power transistor, wherein an anode of a first one of the one or more diodes of the overvoltage protection circuit is electrically connected to the source of the normally-on power transistor, and wherein a cathode of a last one of the one or more diodes of the overvoltage protection circuit is electrically connected to the gate of the normally-on power transistor.

8. The switch device of claim 7, further comprising:
a capacitor in parallel with the one or more diodes of the overvoltage protection circuit.

9. A switch device, comprising:
a first power transistor die that includes a first bidirectional power switch comprising a first source, a second source, a normally-off gate, and a normally-on gate;
a second power transistor die that includes a second bidirectional power switch comprising a first source electrically connected to the second source of the first bidirectional power switch to form a cascode device, a second source, a normally-off gate, and a normally-on gate;
a first capacitor electrically connected between the normally-on gate of the second bidirectional power switch and the first source of the first bidirectional power switch; and
a second capacitor electrically connected between the normally-on gate of the first bidirectional power switch and the second source of the second bidirectional power switch,
wherein the first power transistor die further includes a first voltage clamp circuit comprising a first bidirectional clamp switch having a first gate, a second gate, a first source electrically connected to the first source of the first bidirectional power switch, and a second source electrically connected to the normally-on gate of the second bidirectional power switch, and one or more diodes between the first gate and the second source of the first bidirectional clamp switch,
wherein the second power transistor die further includes a second voltage clamp circuit comprising a second bidirectional clamp switch having a first gate, a second gate, a first source electrically connected to the normally-on gate of the first bidirectional power switch, and a second source electrically connected to the second source of the second bidirectional power switch, and one or more diodes between the second gate and the first source of the second bidirectional clamp switch.

10. The switch device of claim 9, wherein the first power transistor die is a first GaN die and the first bidirectional power switch has at most half a maximum rated source-to-source voltage as the switch device, wherein the second power transistor die is a second GaN die and the second bidirectional power switch has at most half the maximum rated source-to-source voltage as the switch device, and wherein the maximum rated source-to-source voltage of the switch device is 800V or higher.

11. The switch device of claim 9, wherein the first voltage clamp circuit further comprises a first pulldown device configured to prevent turn on of the first bidirectional clamp switch during dynamic switching of the switch device, and wherein the second voltage clamp circuit further comprises a second pulldown device configured to prevent turn on of the second bidirectional clamp switch during dynamic switching of the switch device.

12. The switch device of claim 11,
wherein the first pulldown device comprises:
a first normally-on pulldown transistor having a drain electrically connected to the first gate of the first bidirectional clamp switch, a source electrically connected to the first source of the first bidirectional clamp switch, and a gate electrically connected to the first source of the first bidirectional power switch; and
a first voltage clamp between the source of the first normally-on pulldown transistor and the first source of the first bidirectional power switch,
wherein the second pulldown device comprises:
a second normally-on pulldown transistor having a drain electrically connected to the second gate of the second bidirectional clamp switch, a source electrically connected to the second source of the second bidirectional clamp switch, and a gate electrically connected to the second source of the second bidirectional power switch; and
a second voltage clamp between the source of the second normally-on pulldown transistor and the second source of the second bidirectional power switch.

13. The switch device of claim 12, wherein the first pulldown device further comprises a resistor electrically connected between the first gate and the first source of the first bidirectional clamp switch, and wherein the second pulldown device further comprises a resistor electrically connected between the second gate and the second source of the second bidirectional clamp switch.

14. The switch device of claim 9, further comprising:
a first overvoltage protection circuit configured to turn off the normally-on gate of the first bidirectional power switch when the normally-off gate of the second bidirectional power switch turns off, such that the normally-on gate of the first bidirectional power switch is passively controlled by the normally-off gate of the second bidirectional power switch; and
a second overvoltage protection circuit configured turn off the normally-on gate of the second bidirectional power switch when the normally-off gate of the first bidirectional power switch turns off, such that the normally-on gate of the second bidirectional power switch is passively controlled by the normally-off gate of the first bidirectional power switch.

15. The switch device of claim 14,
wherein the first overvoltage protection circuit comprises one or more diodes in series between the normally-on gate and the second source of the first bidirectional power switch, an anode of a first one of the one or more diodes of the first overvoltage protection circuit is electrically connected to the second source of the first bidirectional power switch, and a cathode of a last one of the one or more diodes of the first overvoltage protection circuit is electrically connected to the normally-on gate of the first bidirectional power switch,
wherein the second overvoltage protection circuit comprises one or more diodes in series between the normally-on gate and the first source of the second bidirectional power switch, an anode of a first one of the one or more diodes of the second overvoltage protection circuit is electrically connected to the first source of the second bidirectional power switch, and a cathode of a last one of the one or more diodes of the second overvoltage protection circuit is electrically connected to the normally-on gate of the second bidirectional power switch.

16. The switch device of claim 15,
wherein the first overvoltage protection circuit further comprises an additional diode having an anode electrically connected to the cathode of the last one of the one or more diodes of the first overvoltage protection circuit and a cathode electrically connected to the anode of the first one of the one or more diodes of the first overvoltage protection circuit,
wherein the second overvoltage protection circuit further comprises an additional diode having an anode electrically connected to the cathode of the last one of the one or more diodes of the second overvoltage protection circuit and a cathode electrically connected to the anode of the first one of the one or more diodes of the second overvoltage protection circuit.

17. The switch device of claim 15, further comprising:
a first capacitor in parallel with the one or more diodes of the first overvoltage protection circuit; and
a second capacitor in parallel with the one or more diodes of the second overvoltage protection circuit.

18. The switch device of claim 9, wherein the first gate and the second gate of the first bidirectional clamp switch are both normally-off gates, and wherein the first gate and the second gate of the second bidirectional clamp switch are both normally-off gates.

19. The switch device of claim 9, wherein the first gate of the first bidirectional clamp switch is a normally-off gate and the second gate of the first bidirectional clamp switch is a normally-on gate, and wherein the first gate of the second bidirectional clamp switch is a normally-on gate and the second gate of the second bidirectional clamp switch is a normally-off gate.

20. A switch device, comprising:
a first normally off switch;
a second normally-off switch;
a first bidirectional power switch comprising a first source electrically connected to a drain of the first normally off switch, a second source, a first normally-on gate electrically connected to a source of the first normally off switch, and a second normally-on gate;
a second bidirectional power switch comprising a first source electrically connected to the second source of the first bidirectional power switch to form a cascode device, a second source electrically connected to a drain of the second normally off switch, a first normally-on gate, and a second normally-on gate electrically connected to a source of the second normally off switch;
a first capacitor electrically connected between the source of the first normally off switch and the first normally-on gate of the second bidirectional power switch;
a second capacitor electrically connected between the second normally-on gate of the first bidirectional power switch and the source of the second normally off switch;
a first voltage clamp circuit comprising a first bidirectional clamp switch having a first gate, a second gate, a first source electrically connected to the source of the first normally off switch, and a second source electrically connected to the first normally-on gate of the second bidirectional power switch, and one or more diodes between the first gate and the second source of the first bidirectional clamp switch; and
a second voltage clamp circuit comprising a second bidirectional clamp switch having a first gate, a second gate, a first source electrically connected to the second normally-on gate of the first bidirectional power switch, and a second source electrically connected to the source of the second normally off switch, and one or more diodes between the second gate and the first source of the second bidirectional clamp switch.

21. The switch device of claim 20, wherein the first voltage clamp circuit further comprises a first pulldown device configured to prevent turn on of the first bidirectional clamp switch during dynamic switching of the switch device, and wherein the second voltage clamp circuit further comprises a second pulldown device configured to prevent turn on of the second bidirectional clamp switch during dynamic switching of the switch device.

22. The switch device of claim 21,
wherein the first pulldown device comprises:
a first normally-on pulldown transistor having a drain electrically connected to the first gate of the first bidirectional clamp switch, a source electrically connected to the first source of the first bidirectional clamp switch, and a gate electrically connected to the source of the first normally off switch; and
a first voltage clamp between the source of the first normally-on pulldown transistor and the source of the first normally off switch,
wherein the second pulldown device comprises:
a second normally-on pulldown transistor having a drain electrically connected to the second gate of the second bidirectional clamp switch, a source electrically connected to the second source of the second bidirectional clamp switch, and a gate electrically connected to the source of the second normally off switch; and
a second voltage clamp between the source of the second normally-on pulldown transistor and the source of the second normally off switch.

23. The switch device of claim 22, wherein the first pulldown device further comprises a resistor electrically connected between the first gate and the first source of the first bidirectional clamp switch, and wherein the second pulldown device further comprises a resistor electrically connected between the second gate and the second source of the second bidirectional clamp switch.

* * * * *